United States Patent [19]

Sogard

[11] Patent Number: 5,602,619

[45] Date of Patent: Feb. 11, 1997

[54] SCANNER FOR STEP AND SCAN LITHOGRAPHY SYSTEM

[75] Inventor: Michael R. Sogard, Menlo Park, Calif.

[73] Assignee: Nikon Precision, Inc., Belmont, Calif.

[21] Appl. No.: 313,383

[22] Filed: Sep. 27, 1994

Related U.S. Application Data

[63] Continuation of Ser. No. 125,601, Sep. 22, 1993, abandoned.

[51] Int. Cl.⁶ ..................................................... G03B 27/54
[52] U.S. Cl. ................................................. 355/53; 355/72
[58] Field of Search ................................. 355/53, 66, 72, 355/75; 430/5

[56] References Cited

U.S. PATENT DOCUMENTS

| | | | |
|---|---|---|---|
| 3,139,013 | 6/1964 | Graves | 95/1.7 |
| 3,592,114 | 7/1971 | Minett | 95/4.5 J |
| 3,610,750 | 10/1971 | Lewis et al. | 355/43 |
| 3,722,996 | 3/1973 | Fox | 355/53 |
| 3,732,009 | 5/1973 | Callum | 355/43 |
| 3,819,265 | 6/1974 | Feldman et al. | 355/51 |
| 4,068,947 | 1/1978 | Buckley et al. | 355/72 |
| 4,241,390 | 12/1980 | Markle et al. | 362/299 |
| 4,336,597 | 6/1982 | Okubo et al. | 364/560 |
| 4,425,508 | 1/1984 | Lewis, Jr. et al. | 250/442.1 |
| 4,444,531 | 4/1984 | Baker et al. | 406/88 |
| 4,516,852 | 5/1985 | Liu et al. | 356/121 |
| 4,539,695 | 9/1985 | La Fiandra | 378/34 |
| 4,616,908 | 10/1986 | King | 350/576 |
| 4,640,619 | 2/1987 | Edmark, III | 356/372 |
| 4,667,415 | 5/1987 | Barsky | 33/568 |
| 4,697,087 | 9/1987 | Wu | 250/548 |
| 4,818,838 | 4/1989 | Young et al. | |
| 4,822,975 | 4/1989 | Torigoe | |
| 4,872,358 | 10/1989 | Buis | 74/99 R |
| 4,953,960 | 9/1990 | Williamson | 350/442 |
| 5,285,236 | 2/1994 | Jain | 355/53 |
| 5,309,198 | 5/1994 | Nakagawa | 355/67 |

FOREIGN PATENT DOCUMENTS

| | | | |
|---|---|---|---|
| 60-71617 | 4/1985 | Japan | H01L 21/30 |

*Primary Examiner*—Safet Metjahic
*Assistant Examiner*—D. P. Malley
*Attorney, Agent, or Firm*—Townsend and Townsend and Crew

[57] ABSTRACT

A mechanical scanner design suitable for use in a step and scan lithography system with arbitrary image magnification includes a projection optical system (20) and a relatively rotatable platform (40). The optical system has the property that a point within a predetermined object field in a first plane is imaged with suitable magnification at a corresponding point within a corresponding image field in a second plane, parallel to the first plane. The object and image fields are displaced from each other. A light source (22) illuminates an aperture such as a slit which is imaged in the object plane, whereupon a slit image is formed in the image plane. The reticle and wafer are mounted to the platform at respective locations in the object and image planes. The axis (42) of relative rotation is perpendicular to the conjugate planes, and located relative to the optical system such that the object field and image field slit images are at respective distances from the rotation axis that are in the ratio equal to the magnification.

32 Claims, 8 Drawing Sheets

SCANNER FOR STEP AND SCAN LITHOGRAPHY SYSTEM

This is a continuation of application Ser. No. 08/125,601 filed Sep. 22, 1993, now abandoned.

BACKGROUND OF THE INVENTION

The invention relates generally to photolithography, and more specifically to step and scan lithography.

The fabrication of integrated circuits entails a number of photolithography steps wherein finely detailed patterns corresponding to the features in different layers of the chip are photographically replicated on a photoresist layer on the surface of a wafer of silicon or other semiconductor material. Depending on the type of photoresist, the exposed parts or the unexposed parts are rendered (or remain) removable, so that after suitable treatment a positive or negative pattern of photoresist corresponding to the projected pattern remains. A typical process may entail up to 20 or more such steps.

The projection process utilizes a set of reticles, with each reticle carrying a pattern corresponding to one layer on one chip. The reticle is itself fabricated in a lithographic process, and comprises a finely etched pattern of metal (such as chrome) on a glass or quartz substrate. The reticle can be used directly or can be copied many times onto a larger plate to produce a mask that corresponds to the pattern for up to the entire wafer surface.

An early approach was contact alignment, where the mask was brought into intimate contact with the photoresist layer, and ultraviolet light from a uniform collimated source illuminated the entire mask. Contact aligners gave way to scanning projection aligners, as exemplified in the system shown in U.S. Pat. No. 4,068,947. The patent describes a system developed and marketed by the Perkin-Elmer Corporation under the trademark MICRALIGN.

In the Perkin-Elmer system, the mask image was projected onto the wafer surface using a mirror system for imaging at 1:1 (unit) magnification. References to reduction or demagnification imply a magnification less than 1.0.

The fixed optical system was characterized by an optical axis and first and second conjugate planes such that a point in one of the planes was imaged at a corresponding conjugate point in the other plane. A light source illuminated a selected area in the object plane of the imaging system where the imaging system possessed optimum imaging properties. In the particular type of imaging system disclosed, the selected region was an annular segment significantly off the optical axis. The reason for such a configuration is that the chord length of an arcuate slit could be extended and the field corrected for aberrations more easily than would be the case for the larger square or rectangular full field.

The wafer and mask were mounted to a carriage, with the mask in the object plane and the wafer surface in the image plane. The carriage was moved so that the illuminated region was scanned across the mask and the corresponding illuminated portion of the image was scanned across the wafer. By scanning in this manner, it was possible to obtain a high-quality image of a large mask on a large wafer, even though the mask and wafer were larger than the area of optimum imaging properties of the optical imaging system. In the particular apparatus, the mask and wafer were mounted to a rotating carriage.

A different approach (referred to as step and repeat) was to use a stepper to sequentially project a full image of the reticle onto each chip region on the wafer. This allowed better overlay alignment since each layer on each chip could be aligned individually. Moreover, the stepper allowed the use of reducing optics, which in turn allowed the reticle to be several times as large as the chip and thus provide improved resolution. However, as feature sizes continued to decrease and chip sizes continued to increase, the demands on a full field optical system became even more stringent, even when required to cover only one chip on the wafer.

This led to the step and scan lithography system, wherein each chip is exposed by scanning onto the wafer the demagnified image of a slit moving over the reticle. The concept is analogous to the MICRALIGN device, with the scanning repeatedly applied over the wafer. However, the MICRALIGN device had 1:1 magnification, which made it relatively straightforward to achieve synchronous scanning of the wafer and reticle relative to the optical system. For a reduction system, the wafer must move more slowly than the reticle, with the speed ratio being equal to the system demagnification (a number less than 1). At present, the only known commercially available step and scan system is marketed by SVGL (a successor to Perkin-Elmer's lithography business) under the trademark MICRASCAN. The synchronous scanning is achieved by using two interferometrically-controlled, air-bearing stages, driven by linear motors. The device presumably works for its intended purpose, but requires a large number of very precise moving parts, and thus is mechanically complex.

In addition to microcircuits, many of the above lithographic techniques have been applied to the fabrication of flat panel displays. These displays are made up of an array of pixels, each of which is a microcircuit, which are independently controllable by electronic circuits, so arbitrary images can be created. The contrast medium itself is often a liquid crystal. The pixel circuitry is built up on a substrate, often glass, by lithographic techniques. The liquid crystal is sandwiched between the circuitry plate and a transparent cover plate. These displays exist in a number of sizes, ranging from liquid crystal display watch faces to thin video displays for laptop computers. In the future, this technology may be applied to larger displays for high definition television.

This lithographic application differs in detail from that described above. Feature sizes are larger, and pattern overlay requirements are looser. However the display sizes may be much larger than the microcircuit chip sizes. These differences are reflected in the lithography tools used to make flat panel displays. Much larger image field sizes are used. Also, the looser image quality tolerances allow less, or no, optical reduction to be used (i.e., larger fractional values of magnification, or unit magnification). This can simplify the optical design, as well as keep the reticle size from getting too large. Indeed, reticle size considerations may dictate lithography machines in the future with greater than 1:1 magnification, rather than reduction optics. In some cases a single reticle may not cover all the features on a single level of the display, so several exposures, with different reticles, on different parts of the display may be required. Careful alignment of the edges of neighboring exposure field on the plate would then be required, to insure continuity of patterns across the boundary between fields, as well as proper exposure dose. This process is referred to as "butting". Both step and repeat and 1:1 magnification scanning systems have been used for flat panel display fabrication.

SUMMARY OF THE INVENTION

The present invention provides a mechanical scanner design suitable for use in a step and scan lithography system with any desired magnification. The scanner mechanism is relatively simple, while being characterized by the precision required for state-of-the-art semiconductor fabrication. Application may be to either microcircuit or flat panel display fabrication.

The invention utilizes a projection optical system and a relatively rotatable platform. In the case of a step and scan lithography system for microcircuit fabrication, the object to be imaged is a reticle corresponding to a single chip on the wafer under fabrication. The optical system has the property that a point within a predetermined object field in a first plane is imaged at less than unit magnification at a corresponding point within a corresponding image field in a second plane, parallel to the first plane. The centers of the object and image fields are displaced from each other. A light source illuminates an aperture such as a slit in the object plane, whereupon a reduced aperture image is formed in the image plane. The reticle and wafer are mounted to the platform at respective locations in the object and image planes.

The axis of relative rotation (referred to as the rotation axis) is perpendicular to the conjugate planes, and located relative to the optical system such that the aperture image at the wafer and the illuminated aperture at the reticle are at respective distances from the rotation axis that are in the ratio equal to the magnification (a number less than 1 for microcircuit fabrication). In a typical embodiment, the aperture extends generally radially with respect to the rotation axis. The reticle and wafer are typically held by respective stages that allow the reticle to be positioned with one of the exposure sites at the aperture image. The aperture is typically longer than the reticle in the radial dimension and narrower in the azimuthal dimension.

As the platform rotates relative to the optical system, a reduced image of the reticle is mapped onto the exposure site on the wafer. The wafer stage is provided with an adequate range of motion to allow the different exposure sites to be moved into the region of the aperture image so that each exposure site can be exposed. The reticle stage is provided with translational and rotational degrees of freedom for alignment purposes, but the stage position does not change during stepping on a wafer. During scanning, no motion of either stage relative to the platform is permitted, and so a high-quality image is produced. The two stages may be on the same side of the pivot or on opposite sides. The optical system must be configured with appropriate numbers of lens and mirror inversions in order to form the proper image mapping, but this is straightforward to achieve.

Because only relative motion is involved, one could also rotate the optical system while keeping the stage platform fixed. The choice is a practical one, depending largely on which subsystem can maintain greater rigidity during motion, which includes both acceleration and deceleration phases.

The use of the invention for flat panel display fabrication can be largely understood from the above description with the following additional information. For a system with a magnification greater than 1, the distance from the rotation axis to the plate is greater than the distance from the rotation axis to the reticle. For the case of unit magnification, there is an obvious interference between reticle and plate location. This can be avoided by placing the plate on the opposite side of the rotation axis from the reticle on a line which passes through the center of the reticle image point and the rotation axis, and at the same distance from the rotation axis. As in the microcircuit case, the location of the rotation axis relative to the plate and reticle places some constraints on the design of the optical imaging system.

A further understanding of the advantages of the present invention may be realized with reference to the remaining portions of the specification and the drawings.

DESCRIPTION OF SPECIFIC EMBODIMENTS

Basic Configuration

Figure 1A:
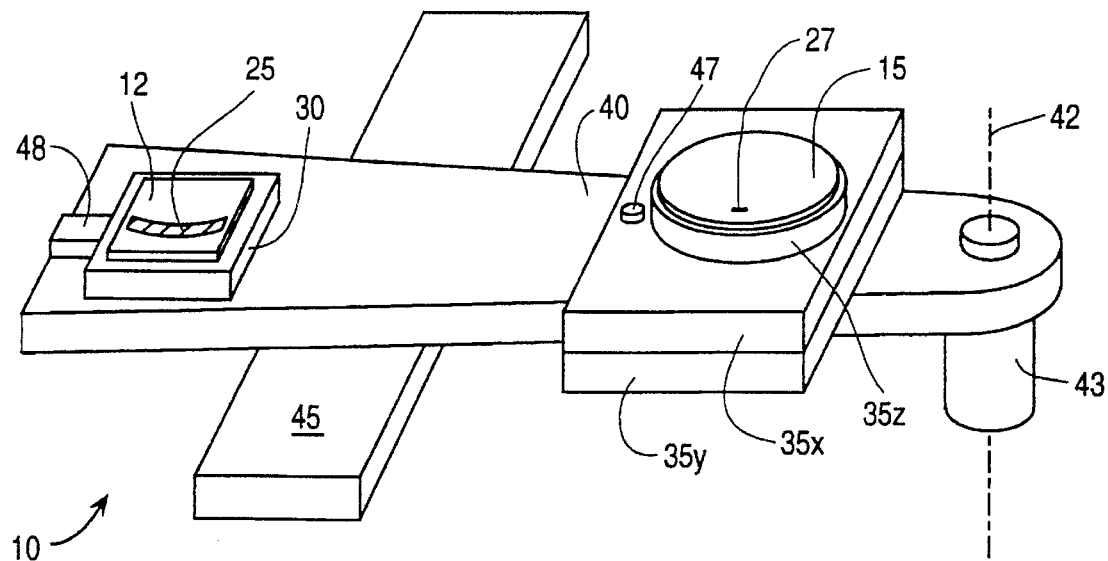
FIG. 1A shows the major components (less the optical projection system) of photolithographic scanning apparatus according to an embodiment of the invention.
Figure 1B:
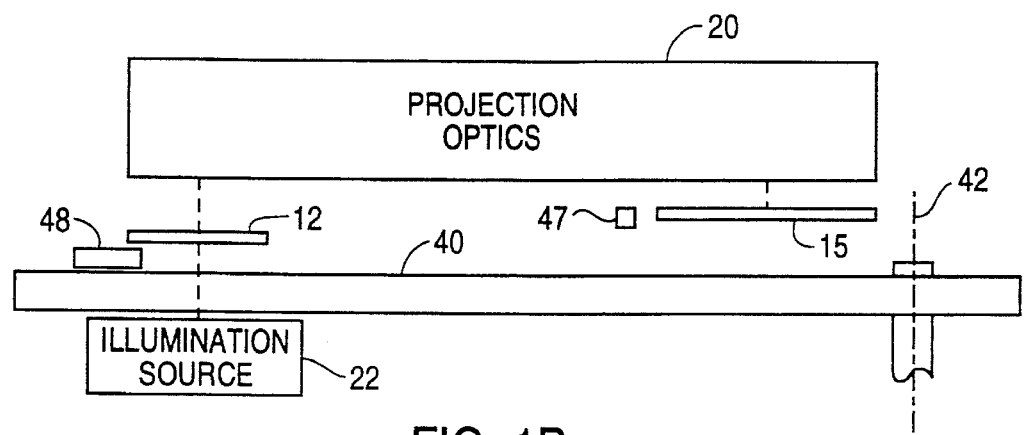
FIGS. 1B is a simplified side view showing the relationship of the optical projection system to the components shown in FIG. 1A.

FIG. 1A is a simplified perspective view of portions of photolithographic scanning apparatus 10 according to an embodiment of the invention suitable for microcircuit fabrication. FIG. 1B is a simplified side view of the apparatus showing components not shown in FIG. 1A. The basic purpose of the apparatus is to form a reduced image of a reticle 12 on a wafer 15. The apparatus provides a mechanism to establish relative movement between the reticle and wafer on one hand and an optical projection system 20 and associated illumination system 22 on the other. The reticle pattern and wafer surface are maintained in parallel planes which are conjugate with respect to the projection system.

The illumination system includes a light source which illuminates an aperture and projects the aperture image into the reticle plane. The projection system transfers the image of that part of the reticle plane illuminated by the aperture into a conjugate plane at the wafer, in general with a change of magnification. Portions of the light path from the illumination system to the wafer are shown in dashed lines. In this arrangement light passes upwardly through the reticle and is projected downwardly on the wafer.

The projection system may be of the type that only images a portion of the reticle at a given time. As mentioned above, a known type of projection system has optimum imaging properties over an annular off-axis segment. Subject to some constraints discussed below, the particular details of the projection system do not form a part of the invention and will not be described further, other than noting that the illumination system illuminates an arcuate slit-like portion 25 of the reticle, which is imaged by the projection system at a correspondingly shaped region 27 on the wafer.

Reticle 12 and a wafer 15 are mounted on precision stages (reticle stage 30 and wafer x-y-z stages 35x, 35y, and 35z), which may be interferometrically controlled. The stages in turn are mounted on a horizontal platform 40, which is rotatable relative to the optical system about a rotation axis 42 that is perpendicular to the conjugate planes of the projection system. A pivot structure 43 provides this relative rotation. In this embodiment, the slit extends generally radially with respect to rotation axis 42. Although it is in principle possible to have the platform fixed and the optical system movable to provide for the relative rotation, it is currently preferred to have the optical system mounted to some fixed structure (not shown) with the platform (and stages) rotatable.

In this particular arrangement, the reticle and wafer are on the same side of rotation axis 42, with the relative distances from the rotation axis to the illuminated aperture image in the reticle plane and the projected aperture image being determined by the desired magnification. As will be shown below, the basic replication accuracy requires a very precise rotary motion. To this end, pivot structure 43 may utilize a hydrostatic or aerostatic bearing. The platform is supported on a bearing surface 45 so as to avoid placing torques on the pivot structure. It is possible to counterbalance the weight of the platform and stages by a weight on the opposite side of the rotation axis; active feedback control may be used to compensate for stage motion.

In operation, the platform is rotated about rotation axis 42, thereby mapping a reduced image of the reticle onto the exposure site on the wafer. Wafer stages 35x and 35y are provided with an adequate range of motion to allow the different exposure sites to be moved into the region of the aperture image so that each exposure site can be exposed. Stage 35z provides vertical (z-axis) movement of the wafer for focusing, and provision is also made for z-axis rotation of the wafer relative to the platform during alignment. Once focusing and alignment have been carried out, however, the wafer remains vertically and rotationally fixed relative to the platform. The reticle stage is provided with translational and rotational degrees of freedom for alignment purposes, but the reticle stage position does not change during stepping on a wafer. During the rotation of the platform, the reticle and wafer stages remain fixed relative to the platform in order to produce a high-quality image.

Optical detectors 47 and 48 are provided for alignment and magnification error correction, as will be described in a later section. Detector 47, referred to as the wafer detector, is mounted to the wafer stage. Detector 48, referred to as the reticle detector, is mounted in a fixed relation to the optical system at a location near the edge of the reticle when the reticle is normally positioned.

Figure 2A:
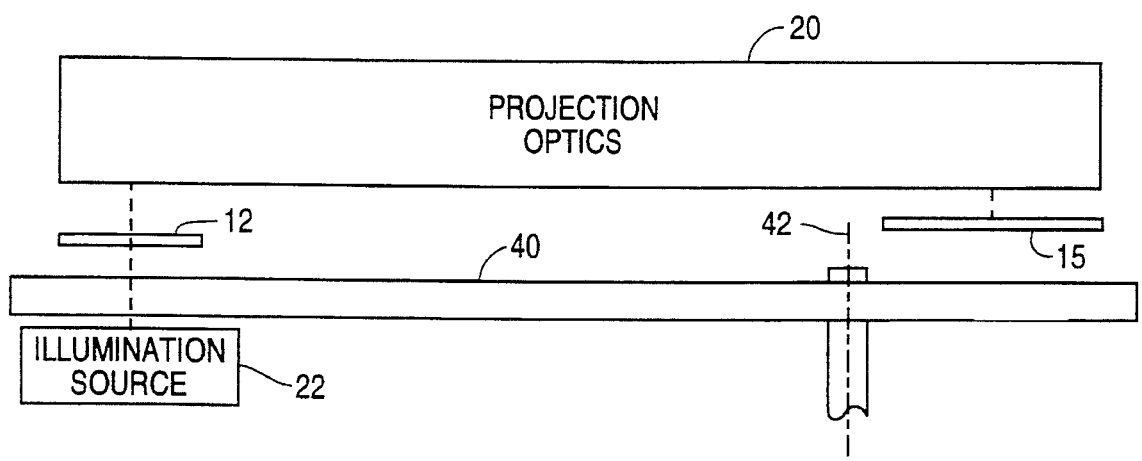
FIGS. 2A and 2B show other embodiments which may be preferred for some optical projection systems.
Figure 2B:
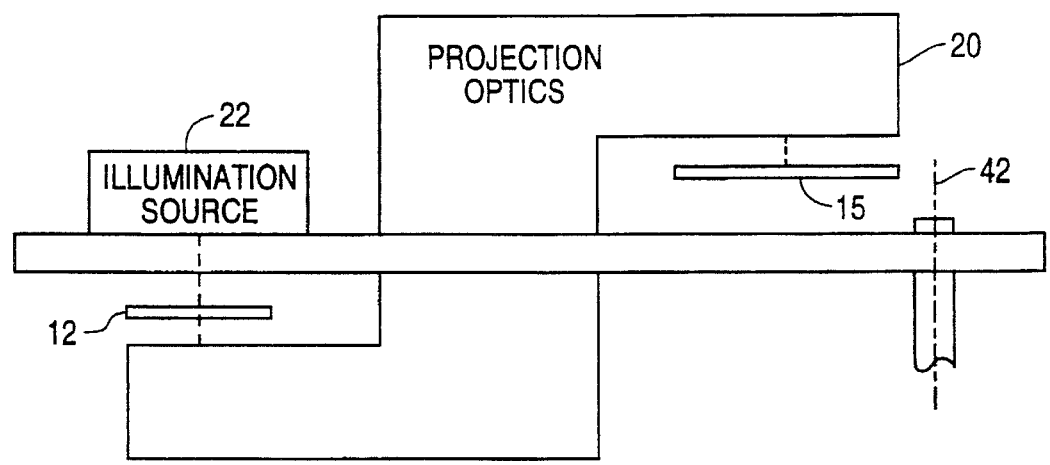

FIGS. 2A and 2B are simplified side views showing alternative arrangements for the projection system and the rotation axis. The same reference numerals are used for elements corresponding to those in FIGS. 1A and 1B. The arrangement of FIG. 2A differs from the arrangement of FIGS. 1A and 1B in that rotation axis 42 is located between the reticle and the wafer. The relative distances from the axis are also determined by the desired magnification, but this placement allows a 1:1 magnification if such is desired. The arrangement of FIG. 2B differs from that of FIGS. 1A and 1B in that the light passes downwardly through the reticle and is also projected downwardly on the wafer.

Exposure During Scan

Figure 3A:
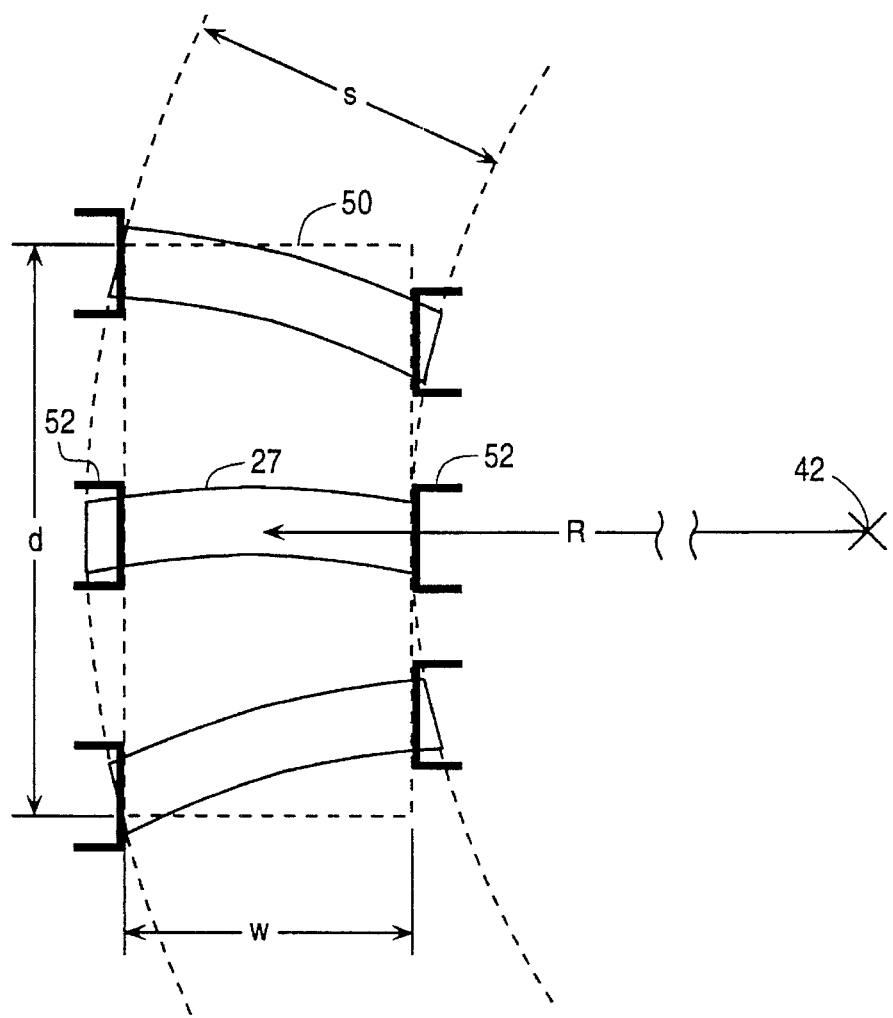
FIG. 3A shows how the image of the slit in the object plane is swept over the exposure site in the image plane to form incremental portions of the image.

FIG. 3A shows how image 27 of the projected slit image moves relative to the exposure site, designated 50, as the platform is rotated. The slit image is shown at three relative positions. The projected slit image is characterized by a length s, which is longer than the exposure site's radial dimension w. As can be seen, the slit image is narrower than the exposure site's azimuthal dimension d. If R is the distance from rotation axis 42 to the center of the exposure site and M is the demagnification factor, the distance to the center of the reticle field is MR. Since R is much greater than d and s, the minimum length by which s must exceed d is approximately $d^2/(8R)$.

In the event that the reticle is not opaque in the regions outside the pattern to be projected, the curved path of the rectangular exposure site relative to the slit image causes some areas beyond the chip boundaries to be illuminated, which may cause exposure of parts of adjacent exposure sites. To avoid this, movable shutters may be included at the ends of the slit, so that as the exposure site moves relative to the slit image, appropriate portions of the slit opening are covered. The image of these shutters, designated 52, is shown for each relative position. An additional set of shutters for blocking the light before and after the slit image has encountered the exposure site is not shown.

Figure 3B:
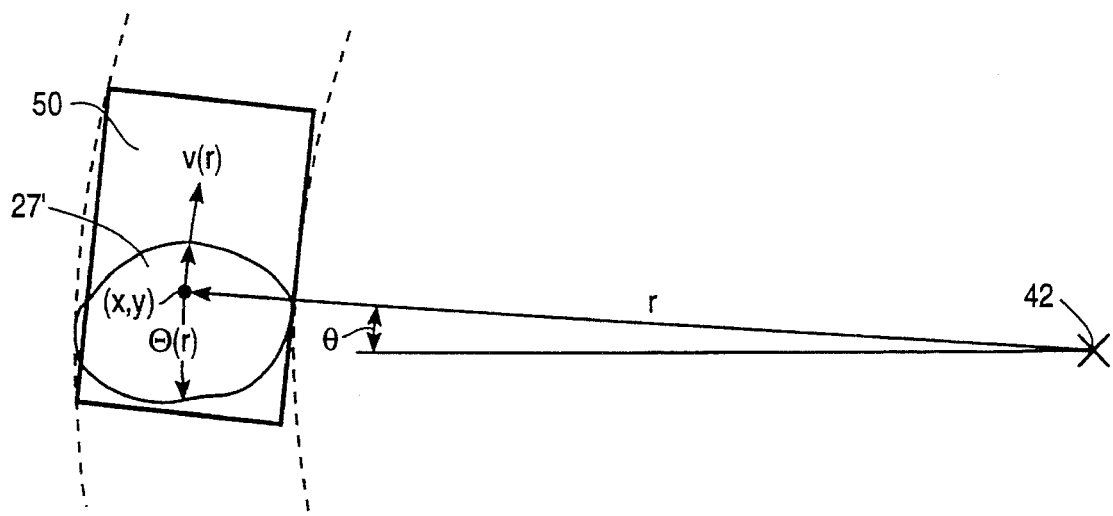
FIG. 3B defines a coordinate system at the wafer to support an analysis of wafer exposure.

The curved path also places some conditions on the aperture shape, which are now derived. The analysis is in terms of polar coordinates r and θ with the origin on the rotation axis. FIG. 3B shows the relative motion of exposure site 50 and an aperture 27' of general shape. A point (x,y) on the chip at a distance r from the rotation axis is exposed for a time t required for the aperture image at radius r to pass by. Note that the aperture velocity increases with r, v=v(r). The aperture opening is defined by an aperture function A(r,θ), which has the property that A(r,θ)=0 beyond the aperture boundary and A(r,θ)=1 (or A(r,θ)≦1 if the aperture is apodized) within the boundary. In general the aperture illumination, I(r,θ), may vary over the aperture. The total exposure of the point (x,y), E(x,y), can then be written as the time integral of the exposure from all points in the aperture at constant radius r:

$$E(x,y)=E(r)=\int[I(r,\theta)A(r,\theta)r/v(r)]d\theta \qquad (1)$$

and v(r)=rdθ/dt. Uniform exposure is then assured if the condition d(E(r))/dr=0 is satisfied.

An important example is the case of uniform illumination, no θ dependent apodization, and constant angular velocity of the exposure site through the aperture image. The above integral can then be written as $$E(r)=\text{constant } A(r)\Theta(r) \qquad (2)$$

where Θ(r) is the angular width of the aperture at radius r and A(r) is the apodization as a function of r. The condition for uniform exposure is then $$d(A(r)\Theta(r))/dr=0 \qquad (3)$$

Figure 3C:
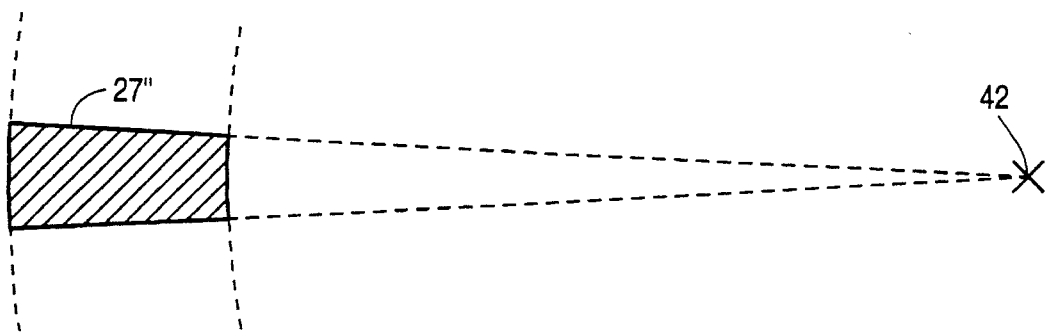
FIGS. 3C and 3D show possible aperture shapes for uniform exposure.
Figure 3D:
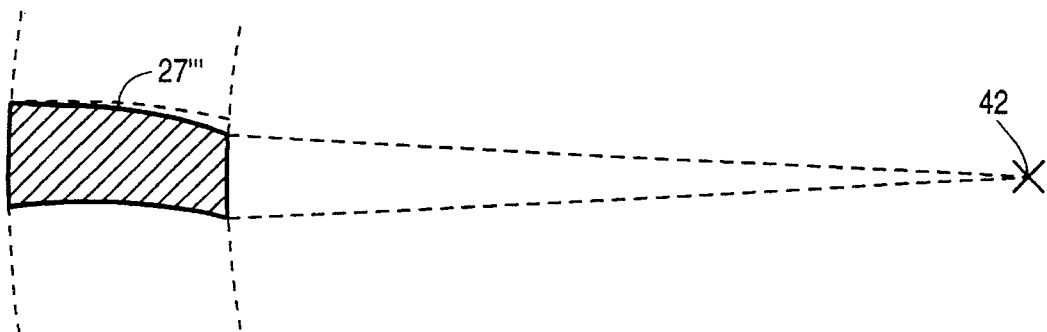

Therefore, uniform exposure is possible so long as any r-dependence of the apodization is cancelled by a corresponding inverse r-dependence of the angular width of the aperture (i.e. the product AΘ is a constant independent of r). If there is no apodization, A(r)=1 and therefore Θ(r) must be a constant independent of r. FIGS. 3C and 3D show two examples of such an aperture: an annular sector 27" and an arcuate slit 27'" that increases in width as r increases. Note that in this context, annular sector 27" is an annular sector with respect to a center that corresponds to rotation axis 42. This is different from the annular segment referred to in connection with the optical imaging system. Arcuate slit 27''' is approximately annular (non-constant width) with respect to a center on the optical axis.

Each of FIGS. 3A–3D shows the illumination pattern, denoted respectively 27, 27', 27'', and 27''', as projected onto wafer 15. It is noted that these illumination patterns are projected versions of corresponding illumination patterns on reticle 12, which are themselves projected images of the illuminated aperture inside illumination system 22. Therefore, each of FIGS. 3A–3D can be considered also to illustrate the illumination patterns in the reticle plane and the illuminated aperture itself inside illumination system 22.

Misalignment and Magnification Mismatch

Figure 4:
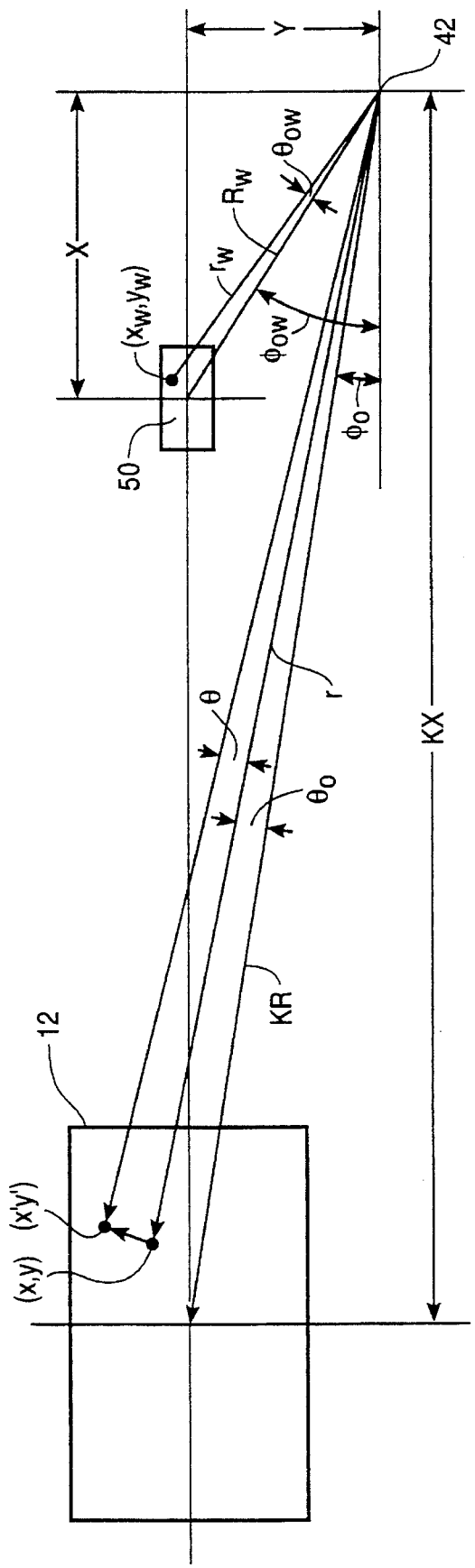
FIG. 4 defines coordinate systems at the reticle and wafer to support an analysis of alignment and magnification errors.

FIG. 4 shows the geometric relationship of the reticle, the exposure site on the wafer, and rotation axis 42. For convenience in the following, the magnification, denoted M, from image to object plane is used here. This is the inverse of the magnification from reticle to wafer plane. Then in normal operation, the image at the wafer is demagnified by the reduction factor 1/M from the illuminated portion of the reticle. It is convenient to define a "rotational" magnification K, which is the ratio of the distances from the rotation axis to the center of the reticle image field and to the wafer image field, respectively. The center of the slit image is located at a radius R from the rotation axis, and the center of the slit illuminated area on the reticle is at a radius KR from the rotation axis. If the projection optical system produces an image at the wafer which is demagnified by the factor 1/K, it will be shown below that as the platform rotates, a demagnified image of the reticle will be mapped onto the wafer.

The mapping can be demonstrated using the coordinate systems shown in FIG. 4. For later use, a more general situation is considered, which includes a misalignment and a mismatch between the magnification of the optical system M and the rotational magnification K. The misalignment of the optical projection system causes the line passing through the optical centers of the wafer and reticle fields to miss the rotation axis by a distance Y.

The radial distances to corresponding points on the reticle and wafer are given respectively by:

$$r = [(KX-x)^2 + (y+Y)^2]^{1/2} \quad (4)$$

$$r_w = [(X-x_w)^2 + (y_w+Y)^2]^{1/2} \quad (5)$$

After the platform rotates through an angle θ, the points (x,y) and ($x_w$, $y_w$) are moved to (x',y') and ($x_w'$, $y_w'$) where it can be shown:

$$\begin{aligned}
x' &= KX - r\cos(\phi_o + \theta_o + \theta) & (6)\\
&= KX - (KX-x)\cos\theta - (y+Y)\sin\theta\\
&= KX(1-\cos\theta) + x\cos\theta - (y+Y)\sin\theta\\
x_w' &= X - r_w\cos(\phi_{ow} + \theta_{ow} + \theta) & (7)\\
&= X - (X-x_w)\cos\theta - (y_w+Y)\sin\theta\\
&= X(1-\cos\theta) + x_w\cos\theta - (y_w+Y)\sin\theta\\
y' &= -Y + r\sin(\phi_o + \theta_o + \theta) & (8)\\
&= -Y + (KX-x)\sin\theta + (y+Y)\cos\theta\\
&= -Y(1-\cos\theta) + (Kx-x)\sin\theta + y\cos\theta
\end{aligned}$$

-continued
$$y_w' = -Y(1-\cos\theta) + (X-x_w)\sin\theta + y_w\cos\theta \quad (9)$$

From above, the properties of the optical projection system insure that:

$$x = Mx_w \quad (10)$$

$$y = My_w \quad (11)$$

Substituting in Eqs. 2 and 4 and rearranging leads to:

$$Mx_w' = MX(1-\cos\theta) + x\cos\theta - (y+MY)\sin\theta \quad (12)$$

$$My_w' = -MY(1-\cos\theta) + MX\sin\theta - x\sin\theta + y\cos\theta \quad (13)$$

Subtracting from Eqs. 1 and 3 leads to:

$$x' - Mx_w' = (K-M)X(1-\cos\theta) + (M-1)Y\sin\theta \quad (14)$$

$$y' - My_w' = (M-1)Y(1-\cos\theta) + (K-M)X\sin\theta \quad (15)$$

This represents the image displacement error referred to the reticle plane. In the wafer plane, these errors are reduced by the optical demagnification 1/M. Now if the rotation is to produce a demagnified image of the reticle on the wafer, the right side of Eqs. 14 and 15 must be zero. This is seen to be the case if there is no misalignment (Y=0) and the rotational and optical magnifications match (K=M). Thus the above assertion is proven.

In general the above conditions of alignment (Y=0) and magnification equality (K=M) will not be met. Initially the optical axis of the projection lens system will not intersect the rotation axis. This must be done as part of the assembly and calibration process. Also the optical and rotational magnifications will generally not be equal, because, among other factors, small changes in the demagnification 1/M are often required to handle small scale differences between a reticle and wafers where small temperature changes exist, or existed during earlier processing steps. The scale differences are caused by thermal expansion and contraction of the reticle and wafer material. Similarly, thermal expansion or contraction of the projection optics may change the distance between the optical centers of the reticle and wafer fields.

These errors can be determined and corrected by a series of measurements of reticle motion using the stage interferometers and the wafer and reticle detectors. Wafer detector 47, which is mounted on the wafer stage to one side of the wafer position is an optical sensor which can accurately determine the center of the image of a small specialized pattern on the reticle. Reticle detector 48, which is mounted near the edge of the reticle, when positioned normally, is a similar detector which can also locate the center of the reticle pattern if the reticle stage is displaced. These detectors are commonly used in optical lithography for alignment purposes.

1. The first step is to determine the optical magnification M. A special reticle is loaded onto the reticle stage with two of the specialized patterns separated by a distance $L_r$ comparable to the largest field size the system will expose. The patterns are positioned so as to lie at the same radial distance from the rotation axis. If they don't initially, the reticle stage can be rotated slightly until the two marks pass under the center of the reticle detector as the platform rotates. (Stage rotation is also a common part of the reticle-wafer alignment process). The separation $L_r$ can then be measured precisely using the reticle stage interferometer and the reticle detector.

The comparable length in the wafer plane is measured by centering one of the patterns over the wafer detector by an appropriate combination of platform rotation and wafer stage motion. The distance to the other pattern $L_w$ is measured by moving the wafer stage until the second pattern is centered on the wafer detector. If the change in stage position measured by the interferometers is $(\Delta x_w, \Delta y_w)$ then the distance is $L_w=(\Delta x_w^2+\Delta y_w^2)^{1/2}$. The optical magnification is then $M=L_r/L_w$.

2. The second step is to determine the errors Y and (K–M). One of the reticle patterns is centered in the reticle detector, and the wafer detector is positioned on the image of the other pattern. (The other pattern is used in case the reticle detector obscures the image of the first pattern). The platform is then rotated through an angle θ, and the pattern displacements x', y', $x_w'$, and $y_w'$ are measured using the interferometers to measure the stage displacements required to recenter the pattern and image. Substituting these values and the optical magnification M into Eqs. 14 and 15 allows a solution for the quantities (K–M)X and Y. Knowing X approximately provides an estimate of (K–M).

3. Knowing Y allows an estimate of the shift required for the optical axis in order to make Y=0. Several iterations of steps 2 and 3 may be required.

4. The fourth step is to make K=M. The rotational magnification is determined by the ratio of the distance KR from the rotation axis to the center of the object field at the reticle, to the comparable distance R to the center of the image field at the wafer. If the distance between the centers of the two fields is D, KR=D+R. The magnification can then be written as $$K=KR/R=(R+D)/R=1+D/R. \qquad (16)$$

Changing R will then change K, but since D is fixed, the reticle stage must be moved K times as far. The process continues as in step 2, rotating the platform and using Eqs. 14 and 15 to determine (K–M)=δK. Differentiating Eq. 16 provides the appropriate displacement δR, which is given by $$\delta R=R^2(-\delta K)/D. \qquad (17)$$

Displacing the wafer stage by δR and the reticle stage by (M+δK)δR should bring the two magnifications into equality. Several iterations may be required.

The precision of the above adjustments is determined by the precision of the basic stage interferometer measurements. The tolerable residual error in the settings must be larger than the precision in order for this procedure to be realistic. This was confirmed by an error budget analysis of Eqs. 14 and 15 for a model system. The assumed conditions were M=4.0 and X=20 cm. A chip size of 30 mm in the direction of rotation was assumed, which would require a total rotation angle of about 8.6°. It was found that total errors in x and y of several nm were possible with errors in the Y adjustment of up to about ±50 nm. The difference between K and M must be less than about $8\times10^{-7}$, which appears to be achievable. The corresponding wafer-reticle stage position error is then about ±3 nm. The accuracy assumed in measuring the reticle and wafer stage positions using the detectors was ±3 nm.

A remaining source of error which must be considered is motion of the pivot during rotation. Such motion is equivalent to changes in X and Y. From above these must be kept less than about ±4 nm in X and ±50 nm in Y. High precision air bearing spindles presently have total runout errors which can be less than about 25 nm for 360° rotations at several hundred RPM. It is likely that much higher accuracies could be achieved for the small angular ranges and low speeds required here. The pivot shifts tend to be largely reproducible, so they could in principle be compensated by appropriate stage motion and projection system actuation.

Constraints on Optical System

While the present invention relates primarily to a scanning mechanism, some comments will be made regarding the optical system, because the scanning strategy imposes some general constraints on the optics. Because the object and image lie in a single plane, or perhaps two parallel planes, some folding of the optical path is required. Mirrors are an obvious choice. Both lenses and mirrors can produce image inversion, however, so the inversions caused by the optical system must be compatible with the scanning motion, or the image will be blurred by the mechanical motion. This has been discussed for the simpler case of unit magnification imaging, where the mask and wafer move together in rectilinear motion (M. Feldman, M. King, U.S. Pat. No. 3,819,265, 1974).

FIGS. 5A–5D provide the first of four four-figure sequences showing the manner in which the projection system constrains the scanning configuration, namely whether the reticle and wafer should be located on the same side of rotation axis 42 or on opposite sides. FIGS. 1A and 1B show the former configuration, FIG. 2A the latter. Alternatively, the following discussion can be viewed as an examination of the particular way that a particular scanning configuration constrains the projection system. As noted above, a magnification of 1 requires that the reticle and wafer be on opposite sides of the rotation axis. Other design considerations may also dictate a particular scanning configuration. As will be seen below, it is always possible to tailor the projection system to the scanning configuration, or vice versa.

Figure 5A:
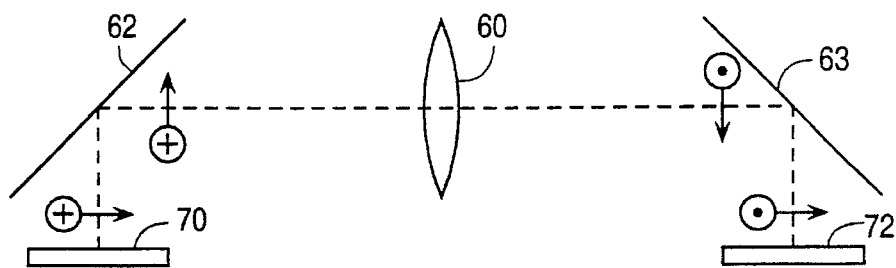
FIGS. 5A–5D, 6A–6D, 7A–7D, and 8A–8D illustrate some constraints placed on the optical projection system by the nature of the scanning.
Figure 5B:
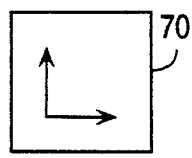
Figure 5B:
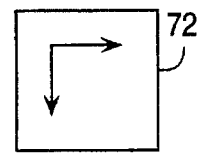

FIG. 5A is a side view of a projection system that comprises a single lens 60 and two mirrors 62 and 63. The object field is denoted 70, the image field 72. Both are shown as lying in a horizontal plane perpendicular to the plane of the drawing. FIG. 5B is a top view of the object and image fields, as they would appear if one could look downwardly through the mirrors. The views are highly schematic and no attempt is made to represent actual dimensions or proportions.

A simple figure consisting of two perpendicular arrows is shown in the top view and is also shown in the side view as it traverses the projection system. It is to be understood that the representations of the arrows at various intermediate locations do not represent images, but rather indicate the effect of the lens and the mirrors on the ultimate image. As can be seen, reflection from either of the mirrors does not invert the arrow that extends parallel to the plane of the mirror, but does invert the other arrow. The lens, on the other hand, inverts both arrows. The result is an image which is the mirror inversion of the object, reflected through a plane that contains the centers of the object and image fields and is mutually perpendicular to the object and image plane.

Figure 5C:
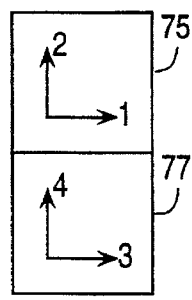
Figure 5C:
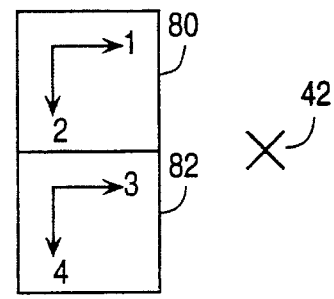
Figure 5D:
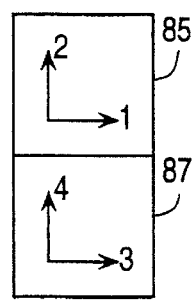
Figure 5D:
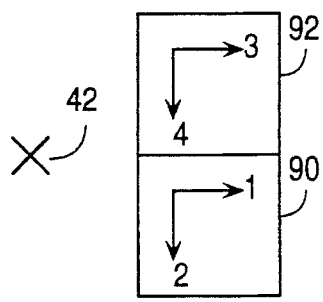

FIGS. 5C and 5D shows how the projection system maps image portions for the two cases where the object and the image are on the same side of rotation axis 42 and where they are on opposite sides. The effect of rotation of the platform can be seen most easily by making the distances of object and image from the rotation axis sufficiently large that negligible rotation occurs as the initially imaged part of the object is just moved out of the region of the imaging field. The rotation then is approximately a linear translation.

In the first case, where the object and image fields move in the same direction, the incremental portions of the image build up in the same direction as the incremental portions of the object are acquired. Sequential portions of the object (and corresponding image) are denoted with the numbers 1 and 2 for the arrows in the first portion and with the numbers 3 and 4 for the arrows in the second portion. Specifically, first and second object portions 75 and 77 are mapped to respective image portions 80 and 82. What can be seen is that image portions 80 and 82 are in a different relationship to that of object portions 75 and 77. This is a relationship that cannot be transformed to the original relationship by any combinations of reflections or rotations. Put another way, the projection system shown in FIG. 5A cannot produce an image by scanning when the object and image are on the same side of the rotation axis.

In the second case, where the object and image fields move in opposite directions, the incremental portions of the image build up in opposite directions as the incremental portions of the object are acquired. Sequential portions 85 and 87 of the object are mapped to respective image portions 90 and 92. What can be seen is that image portions 90 and 92 form a composite image that is a mirror image of the composite object, but a mirror image that merely reflects the way that the projection system maps a stationary object. That is, the projection system shown in FIG. 5A does produces a scanned image when the object and image are on the same side of the rotation axis.

Figure 6A:
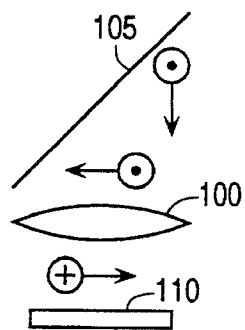
Figure 6A:
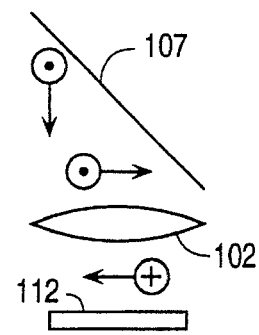
Figure 6B:
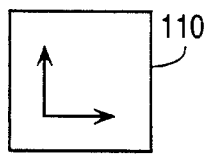
Figure 6B:
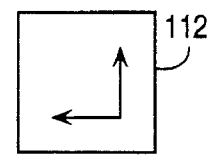
Figure 6C:
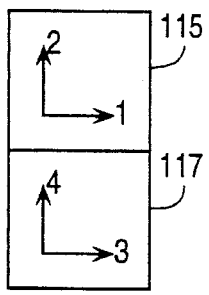
Figure 6C:
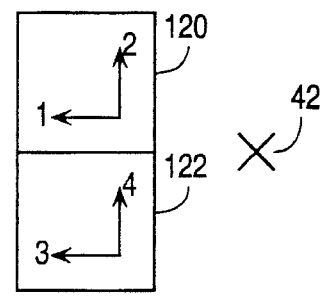
Figure 6D:
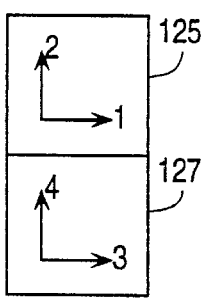
Figure 6D:
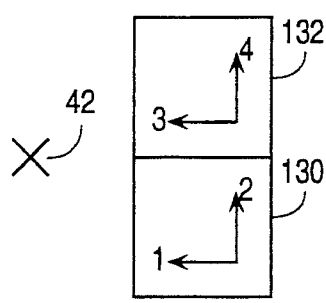

FIGS. 6A–6D provide a similar sequence of views showing the image formation and non-formation for a projection system that comprises two lenses 100 and 102 and two mirrors 105 and 107. The object field is denoted 110, the image field 112. In this case the projection system provides a mirror image of the object, reflected through a plane that is perpendicular to the line joining the centers of the object and image fields. As can be seen in FIG. 6C, when the object and the image are on the same side of the rotation axis, object portions 115 and 117 are mapped to image portions 120 and 122, and the composite image is a correct mirror image of the object. FIG. 6D shows the situation where object portions 125 and 127 on one side of the rotation axis are mapped to image portions 130 and 132 on the other side of the rotation axis. The image portions are in a different relationship that cannot form the basis of a scanned image.

Figure 7A:
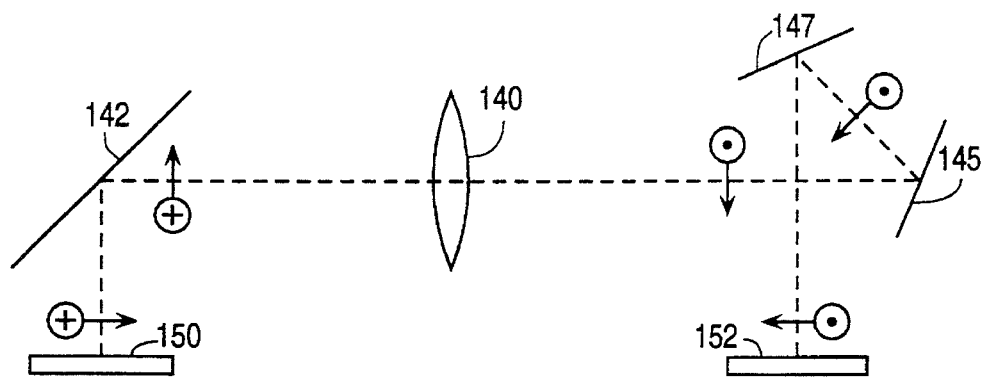
Figure 7B:
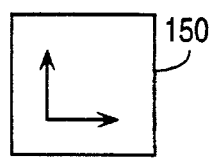
Figure 7B:
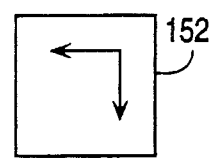
Figure 7C:
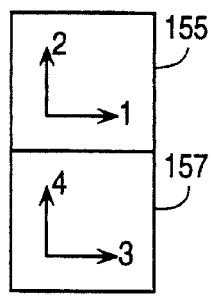
Figure 7C:
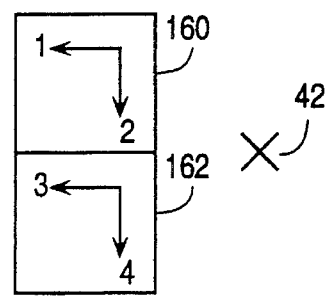
Figure 7D:
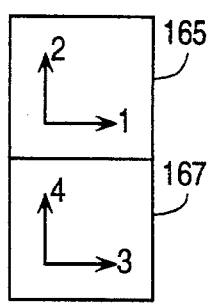
Figure 7D:
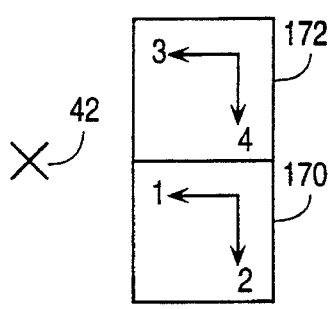

FIGS. 7A–7D provide a similar sequence of views showing the image formation and non-formation for a projection system that comprises a single lens 140 and three mirrors 142, 145, and 147. The object field is denoted 150, the image field 152. In this case the projection system provides an image of the object, rotated by 180°. FIG. 7C shows the situation when object portions 155 and 157 are mapped to image portions 160 and 162 on the same side of the rotation axis. In this case there is no correct image of the object. FIG. 7D shows the situation where object portions 165 and 167 on one side of the rotation axis are mapped to image portions 170 and 172 on the other side of the rotation axis. In this case a composite image of the object is formed, rotated by 180°.

Figure 8A:
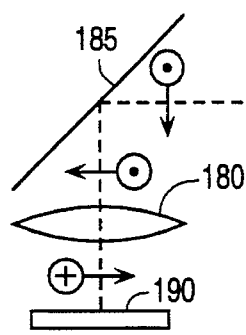
Figure 8A:
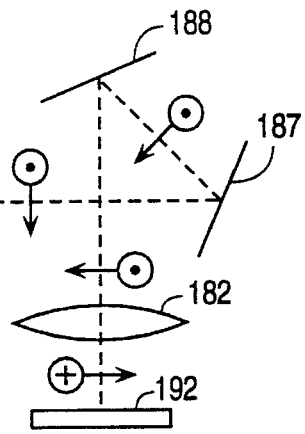
Figure 8B:
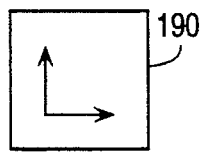
Figure 8B:
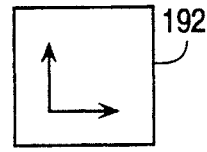
Figure 8C:
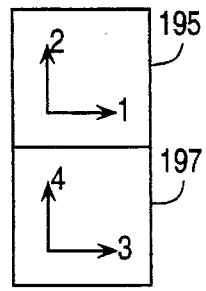
Figure 8C:
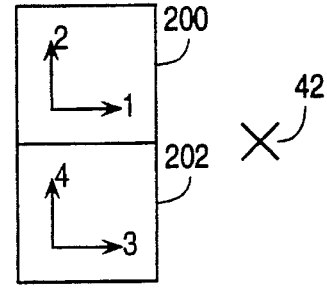
Figure 8D:
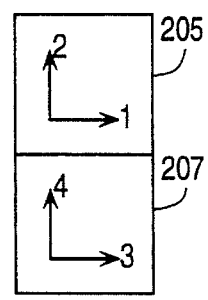
Figure 8D:
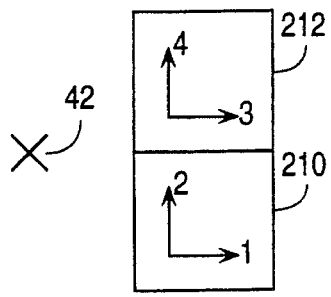

FIGS. 8A–8D provide a similar sequence of views showing the image formation and non-formation for a projection system that comprises two lenses 180 and 182 and three mirrors 185, 187, and 188. The object field is denoted 190, the image field 192. In this case the projection system provides an upright image of the object. As can be seen in FIG. 8C, when the object and the image are on the same side of the rotation axis, object portions 195 and 197 are mapped to image portions 200 and 202, and the composite image is a correct upright image of the object. FIG. 8D shows the situation where object portions 205 and 207 on one side of the rotation axis are mapped to image portions 210 and 212 on the other side of the rotation axis. The image portions are in a different relationship that cannot form the basis of a scanned image.

Thus it can be seen that for each configuration, by positioning the reticle and wafer relative to the pivot appropriately, it is always possible to obtain an image during scanning. However for an even number of mirrors, the image always suffers a mirror inversion. For an odd number of mirrors the image faithfully reproduces the object figure. Also, for an even number of lenses the image and object figures have the same orientation, while for an odd number of lenses the image and object figures are rotated 180° from each other.

In each configuration, by positioning the reticle and wafer relative to the pivot appropriately, it is always possible to obtain an image during scanning. However for an even number of mirrors, the image always suffers a mirror inversion. For an odd number of mirrors the image faithfully reproduces the object figure. Also, for an even number of lenses the image and object figures have the same orientation, while for an odd number of lenses the image and object figures are rotated 180° from each other.

Conclusion

In conclusion it can be seen that the present invention provides a simple and precise scanning mechanism. The magnification and alignment are adjustable and controllable using straightforward techniques.

While the above is a complete description of a specific embodiment of the invention, alternatives are possible. Therefore, the above description should not be taken as limiting the scope of the invention which is defined by the claims.

What is claimed is:

1. Photolithography apparatus comprising:

an optical system characterized by an optical axis and first and second parallel conjugate planes such that each point within a predetermined object field in said first plane is imaged with a magnification different from unity at an optically conjugate point within a corresponding image field in said second plane;

a rigid element mounted for rotation over an angular range relative to said optical system about a rotation axis perpendicular to said first and second planes;

said rotation axis being located relative to said optical system so that a given point in said object field at a first radial distance from said rotation axis is imaged at a conjugate point in said image field at a second radial distance from said rotation axis, the ratio between said second and first radial distances being substantially equal to said magnification;

a mask stage, mounted to said rigid element, for holding a mask in said first plane at said object field;

a substrate stage, mounted to said rigid element, for holding an image-receiving object in said second plane at said image field; and an illumination system having portions defining an aperture, means for forming an image of said aperture in said first plane, and at least one movable shutter to block selected portions of said aperture, said movable shutter having a position that changes as a function of an angular position of said rigid element relative to said optical system as said rigid element rotates relative to said optical system;

whereby illuminating at least a portion of said object field and rotating said rigid element relative to said optical system causes portions of the mask to be imaged on corresponding portions of the image-receiving object.

2. The apparatus of claim 1 wherein said magnification is less than 1.

3. The apparatus of claim 1 wherein said mask stage and said substrate stage are on opposite sides of said rotation axis.

4. The apparatus of claim 1 wherein said mask stage and said substrate stage are on the same side of said rotation axis.

5. The apparatus of claim 1 wherein said optical system is fixed and said rigid element is movable.

6. The apparatus of claim 1 wherein said substrate stage includes mutually perpendicular x, y, and z substages.

7. The apparatus of claim 1 wherein said object field is significantly off-axis with respect to said optical system.

8. The apparatus of claim 1 wherein said first and second planes are spaced apart from each other.

9. The apparatus of claim 1 wherein:

said image of said aperture is an annular sector bounded by two concentric circular arcs in said first plane and two straight lines in said first plane;

said circular arcs have a common center on said rotation axis; and said straight lines pass through a common point on said rotation axis.

10. The apparatus of claim 1 wherein said image of said aperture is an arcuate slit extending generally radially away from said rotation axis and having a width that increases as a function of distance from said rotation axis.

11. The apparatus of claim 1 wherein:

said illumination system illuminates said aperture uniformly;

said aperture is configured with a shape that is characterized by an angular width that is a function of the distance from said rotation axis; and said aperture is apodized with a dependence on distance from said rotation axis that has the inverse dependence on distance from said rotation axis as does the angular width.

12. A projection exposure apparatus for projecting an image of a mask pattern onto a substrate by rotating a platform structure supporting said mask and substrate relative to a projection optical system, the apparatus comprising:

(a) an illumination system for illuminating a slit-shaped illumination region in the plane of the mask in order to project a slit-like image of the mask pattern onto the substrate through said projection optical system, said slit-shaped portion and said slit-like image extending generally radially with respect to a rotation axis of said platform structure;

(b) a mask stage for holding the mask and moving the mask on said platform structure in a plane perpendicular to said rotation axis;

(c) a substrate stage for holding the substrate and moving the substrate on said platform structure in a plane perpendicular to said rotation axis; and (d) a variable aperture member for changing an effective size of said slit-like image of the mask pattern projected onto a predetermined site of the substrate in response to changes of an angular position of said platform structure during a rotation operation of said platform structure.

13. The apparatus of claim 12 wherein:

said platform structure has a predetermined rotational magnification substantially equal to an optical magnification of said projection optical system; and said rotational magnification is a ratio of first radial distance between said illumination region and said rotation axis and a second radial distance between the projected portion of the substrate and said rotation axis.

14. The apparatus of claim 13 wherein:

said optical and rotational magnifications are less than unity; and said mask and substrate stages are on opposite sides of said rotation axis.

15. The apparatus of claim 13 wherein:

said optical and rotational magnifications are less than unity; and said mask and substrate stages are on the same side of said rotation axis.

16. The apparatus of claim 13 wherein:

said optical and rotational magnifications are unity; and said mask and substrate stages are on opposite sides of said rotation axis.

17. The apparatus of claim 13 wherein said aperture member is disposed in said illumination system for changing a size of said slit-shaped portion of accordance with said angular position of said platform structure.

18. The apparatus of claim 17 wherein said illumination system comprises means for forming an aperture image of said aperture member so as to define said illumination region.

19. The apparatus of claim 18 wherein the shape of said aperture image is an annular sector bounded by two concentric circular arcs in the plane of the mask and two straight lines in the plane of the mask, said circular arcs having a common center on said rotation axis, said straight lines passing through a common point on said rotation axis.

20. The apparatus of claim 18 wherein the shape of said aperture image is that of an arcuate slit extending generally radially away from said rotation axis and having a width that increases as a function of distance from said rotation axis.

21. The apparatus of claim 16, wherein the shape of said aperture image is an annular sector bounded by two concentric circular arcs and two straight lines spaced from each other in a direction corresponding to the radial direction with respect to said rotation axis, and each position of said two straight lines is changeable in accordance with said angular position of said platform structure.

22. The apparatus of claim 31 wherein:

said illumination system includes a light source to illuminate said aperture member uniformly;

said aperture member is configured with a shape characterized by an angular width that is a function of the distance from said rotation axis; and said aperture member is apodized with a dependence on distance from said rotation axis that has the inverse dependence on distance from said rotation axis as does the angular width.

23. The apparatus of claim 13 wherein a width of said slit-like image defined by said aperture member is determined as a function of said second radial distance.

24. A photolithographic exposure method for illuminating a portion of a mask with radiation, projecting an image of the illuminated pattern of the mask onto a substrate through an optical imaging system, and rotating the substrate and mask as a unit about a rotation axis away from each of the mask and substrate for a rotational scanning exposure, the optical imaging system having an optical magnification, the method comprising the steps of:

(a) mounting the mask on a platform structure rotatable about said rotation axis so as to keep a first distance between said rotation axis and said illuminated portion of the mask, and mounting the substrate on said platform structure so as to keep a second distance between said rotation axis and a portion of the substrate projected by the pattern image of the mask;

(b) measuring a relative positional deviation of the mask and substrate caused by (i) a magnification error between said optical magnification of said optical imaging system and a rotational magnification defined as a ratio of said first and second distances, and (ii) an alignment error between said rotation axis and said optical imaging system;

(c) using said relative positional deviation and said optical magnification, so determined, to determine said magnification error and said alignment error;

(d) correcting a positional relationship of said rotation axis and said optical imaging system in accordance with said alignment error, so determined; and (e) correcting a positional relationship of the mask and substrate on said platform structure in accordance with said magnification error, so determined, said steps (d) and (e) being carried out before carrying out said rotational scanning exposure.

25. The method of claim 24 wherein said platform structure includes a mask stage mounted movably thereon for holding the mask and a substrate stage mounted movably thereon for holding the substrate.

26. The method of claim 25 wherein said correcting of the positional relationship of the mask and substrate is performed by said mask and substrate stages.

27. The method of claim 26 wherein said error between the optical and rotational magnifications is measured by using an optical detector disposed at said substrate stage for detecting marks provided with the mask through said imaging system and an interferometer system for detecting a coordinate position of said substrate stage.

28. The method of claim 26 wherein said platform structure is supported by a pivot structure that defines said rotation axis.

29. The method of claim 28 wherein said pivot structure includes a hydrostatic or aerostatic bearing system.

30. The method of claim 28, further comprising a step of compensating a translational deviation of the rotation axis in accordance with an accuracy of said pivot structure by actuating at least one of said two stages during said rotational scanning exposure.

31. A rotation exposure method for projecting a pattern image of a mask onto a substrate by rotating a platform structure supporting both the mask and the substrate relative to a projection optical system, the method comprising the steps of:

(a) illuminating the mask with a slit-shaped light in order to project a slit-like image of the mask pattern onto a site of the substrate through said projection optical system, said slit-shaped light and slit-like image being extended substantially radially with respect to a rotation axis of said platform structure; and (b) changing a size of said slit-shaped light irradiated to the mask in response to changes of an angular position of said platform structure during the rotation exposure of said site of the substrate by the rotation of said platform structure.

32. The rotation exposure method of claim 31 wherein said changing step is performed to change each position of two straight boundaries defining the size of said slit-shaped light radially.

* * * * *